(12) United States Patent
Mori

(10) Patent No.: US 10,985,153 B2
(45) Date of Patent: Apr. 20, 2021

(54) SEMICONDUCTOR DEVICE

(71) Applicant: TOSHIBA MEMORY CORPORATION, Tokyo (JP)

(72) Inventor: Takahiro Mori, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 57 days.

(21) Appl. No.: 16/559,374

(22) Filed: Sep. 3, 2019

(65) Prior Publication Data

US 2020/0294982 A1    Sep. 17, 2020

(30) Foreign Application Priority Data

Mar. 14, 2019 (JP) .............................. JP2019-046972

(51) Int. Cl.
*H01L 23/00* (2006.01)
*H01L 23/498* (2006.01)
*H01L 25/18* (2006.01)

(52) U.S. Cl.
CPC ........ *H01L 25/18* (2013.01); *H01L 23/49838* (2013.01); *H01L 24/32* (2013.01); *H01L 24/48* (2013.01); *H01L 24/73* (2013.01); *H01L 23/49827* (2013.01); *H01L 2224/32225* (2013.01); *H01L 2224/48227* (2013.01); *H01L 2224/73265* (2013.01)

(58) Field of Classification Search
CPC . H01L 2224/32225; H01L 2224/48227; H01L 2224/73265; H01L 2924/00; H01L 2225/06506; H01L 2225/0651; H01L 2225/06562; H01L 23/49827; H01L 23/49838; H01L 23/562; H01L 24/32; H01L 24/48; H01L 24/73; H01L 25/0657; H01L 25/18
USPC ........................................................ 257/773
See application file for complete search history.

(56) References Cited

U.S. PATENT DOCUMENTS 7,728,421 B2   6/2010  Tanoue
8,243,462 B2   8/2012  Shibuya
(Continued)

FOREIGN PATENT DOCUMENTS

JP    2003-069168 A    3/2003
JP    2014-110266 A    6/2014
(Continued)

*Primary Examiner* — Long K Tran
(74) *Attorney, Agent, or Firm* — Foley & Lardner LLP

(57) ABSTRACT

According to one embodiment, a semiconductor device includes: a printed wiring substrate that includes a substrate, a wiring layer on the substrate, and a first insulating layer on the wiring layer. The wiring layer includes a connection terminal and a wiring electrically connected to the connection terminal. The first insulating layer includes an opening that exposes at least a portion of the connection terminal and at least a portion of the wiring, and at least one of a protrusion portion or a recess portion, provided along an edge of the opening, that overlaps the wiring. The semiconductor device includes a semiconductor chip mounted on the printed wiring substrate; a bonding wire that electrically connects the connection terminal and the semiconductor chip; and a second insulating layer that covers the semiconductor chip, the bonding wire, and the opening.

13 Claims, 4 Drawing Sheets

(56) References Cited

U.S. PATENT DOCUMENTS

| | | | | |
|---|---|---|---|---|
| 2006/0160383 A1* | 7/2006 | Yamada | ............. | H01R 13/2414 |
| | | | | 439/86 |
| 2010/0103634 A1* | 4/2010 | Funaya | ................. | H05K 1/185 |
| | | | | 361/761 |
| 2014/0360765 A1* | 12/2014 | Kiwanami | ........ | H01L 23/49822 |
| | | | | 174/260 |

FOREIGN PATENT DOCUMENTS

| JP | 2014-110267 A | 6/2014 |
|---|---|---|
| JP | 2014-1110268 A | 6/2014 |

\* cited by examiner

SEMICONDUCTOR DEVICE

CROSS-REFERENCE TO RELATED APPLICATION(S)

This application is based upon and claims the benefit of priority from Japanese Patent Application No. 2019-046972, filed Mar. 14, 2019, the entire contents of which are incorporated herein by reference.

FIELD

Embodiments described herein relate generally to a semiconductor device.

BACKGROUND

In recent years, with the development of communication technology and information processing technology, downsizing and increasing the speed of semiconductor devices such as memories are desirable. Accordingly, development of a semiconductor package having a three-dimensional structure in which a plurality of semiconductor chips is stacked has been advanced.

For example, the semiconductor package has a film-on device (FOD) structure formed by mounting a semiconductor chip on a printed wiring substrate, connecting a bonding pad of the printed wiring substrate and the semiconductor chip with bonding wires, and covering the semiconductor chip and the bonding wires with a die attach film.

Examples of related art include JP-A-2003-069168.

DETAILED DESCRIPTION

Figure 1:
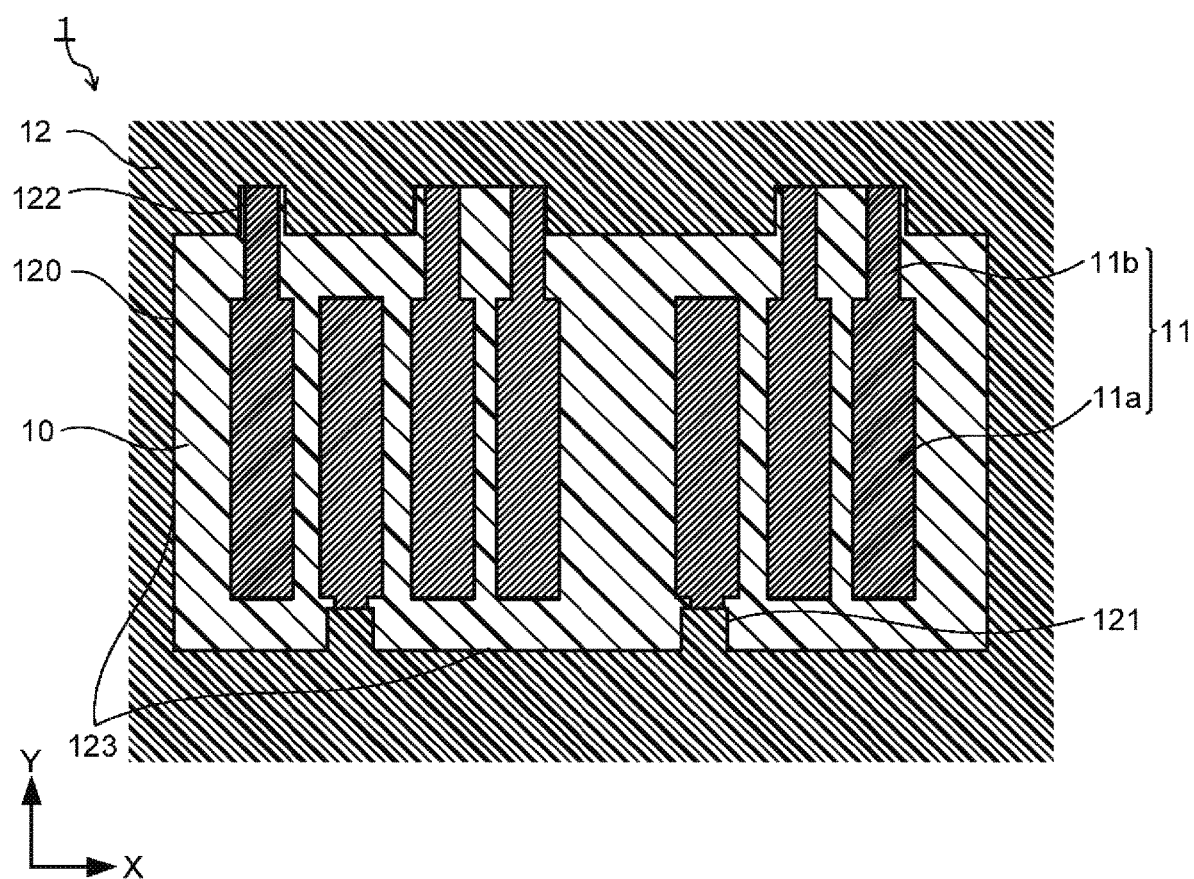
FIG. 1 is a schematic top view showing a structural example of a printed wiring substrate.

Embodiments provide a semiconductor device that prevents cracks of wiring of a printed wiring substrate.

In general, according to one embodiment, a semiconductor device includes: a printed wiring substrate that includes a substrate, a wiring layer provided on the substrate, and a first insulating layer provided on the wiring layer. The wiring layer includes a connection terminal and a wiring electrically connected to the connection terminal. The first insulating layer includes an opening that exposes at least a portion of the connection terminal and at least a portion of the wiring, and at least one of a protrusion portion or a recess portion, provided along a first edge of the opening, that overlaps the wiring; a semiconductor chip mounted on the printed wiring substrate; a bonding wire that electrically connects the connection terminal and the semiconductor chip; and a second insulating layer that covers the semiconductor chip, the bonding wire and the opening.

Hereinafter, embodiments will be described with reference to drawings. The relationship between the thickness and the planar dimension of each component described in the drawings, the proportion of the thickness of each component, and the like may differ from an actual one. In the embodiments, substantially the same components are denoted by the same reference numerals, and the description thereof will be appropriately omitted.

Figure 2:
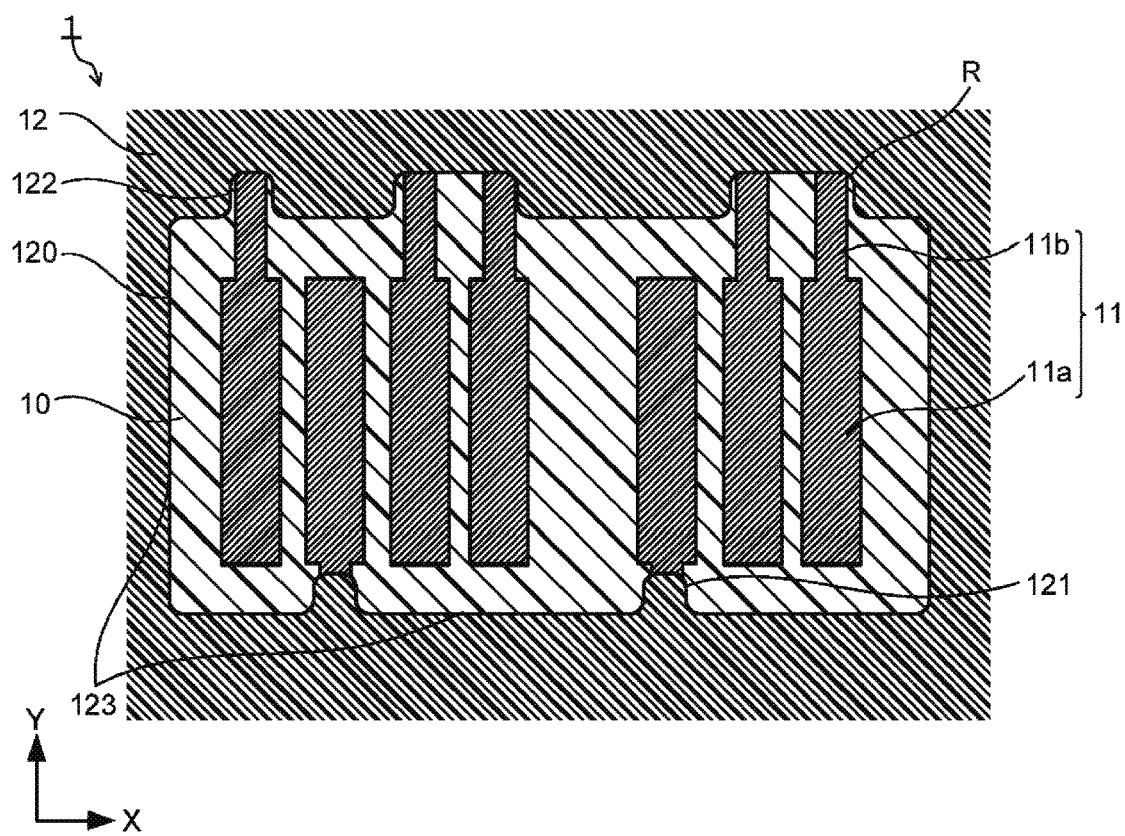
FIG. 2 is a schematic top view showing a structural example of the printed wiring substrate.

The structure of a printed wiring substrate applicable to a semiconductor device of the embodiments will be described with reference to FIGS. 1 and 2. FIGS. 1 and 2 are schematic top views showing an example of the structure of a printed wiring substrate 1 and show a portion of an X-Y plane including an X axis of a chip-mounted surface of the printed wiring substrate 1 and a Y axis orthogonal to the X axis.

The printed wiring substrate 1 includes a substrate 10, a wiring layer 11 provided on the substrate 10, and an insulating layer 12 provided on the wiring layer 11. A plurality of internal wiring layers (not shown) may be formed inside the substrate 10. The internal wiring layer may be electrically connected to the wiring layer 11.

For example, a glass substrate, a ceramic substrate, or a resin substrate such as glass epoxy may be used as the substrate 10. The substrate 10 may be flexible.

The wiring layer 11 includes a connection terminal 11a and a wiring 11b electrically connected to the connection terminal 11a. The wiring layer 11 is formed, for example, by applying nickel plating or gold plating to the surface as needed using a metal film containing copper or silver as a main component or a conductive paste containing copper or silver.

Examples of the connection terminal 11a include a bonding pad and a land. A plurality of connection terminals 11a are juxtaposed (or arranged side-by-side with one another), for example, on the surface of the substrate 10, and each of the connection terminals 11a is electrically connected to the corresponding wiring 11b.

The wiring 11b has a function as a signal wiring or a power supply wiring according to the type of the connection terminal 11a. The plurality of wirings 11b is juxtaposed on the surface of the substrate 10. One of the plurality of wirings 11b may extend in a direction different from that of the other one of the plurality of wirings 11b as shown in FIGS. 1 and 2.

For example, a solder resist may be used as the insulating layer 12. The insulating layer 12 includes an opening 120, a protrusion portion 121, a recess portion 122, and a flat portion 123. The protrusion portion 121, the recess portion 122, and the flat portion 123 are provided at the edge of the opening 120. The opening 120, the protrusion portion 121, the recess portion 122, and the flat portion 123 are formed by etching a portion of the insulating layer 12, for example. The insulating layer 12 may not include one of the protrusion portion 121 and the recess portion 122.

The opening 120 exposes the connection terminal 11a and a portion of the wiring 11b from the insulating layer 12. At least one of the corners facing the opening 120, at least one of the corners of the protrusion portion 121, or at least one of the corners of the recess portion 122 may have a curved surface R as shown in FIG. 2. Further, in FIGS. 1 and 2, the edge of the opening 120 extends along a direction (Y-axis direction) perpendicular to the extending direction of the wiring 11b, but the embodiment is not limited thereto and may extend along the direction intersecting with the extending direction of the wiring 11b.

The protrusion portion 121 extends, for example, to protrude from the edge of the opening 120 toward the inside of the opening 120. The protrusion portion 121 overlaps with one of the plurality of wirings 11b. The protrusion portion 121 may overlap with two or more adjacent wirings 11b. The width of the protrusion portion 121 is, for example, wider than the width of the wiring 11b.

The recess portion 122 extends, for example, from the edge of the opening 120 toward the outside of the opening 120. The recess portion 122 overlaps with one of the plurality of wirings 11b. The recess portion 122 may overlap with two or more adjacent wirings 11b. The width of the recess portion 122 is, for example, wider than the width of the wiring 11b.

The flat portion 123 is adjacent to, for example, the protrusion portion 121 or the recess portion 122. The flat portions 123 are also provided between the protrusion portions 121 and between the recess portions 122 as shown in FIG. 1 and overlap with the regions between the adjacent wirings 11b.

Figure 3:
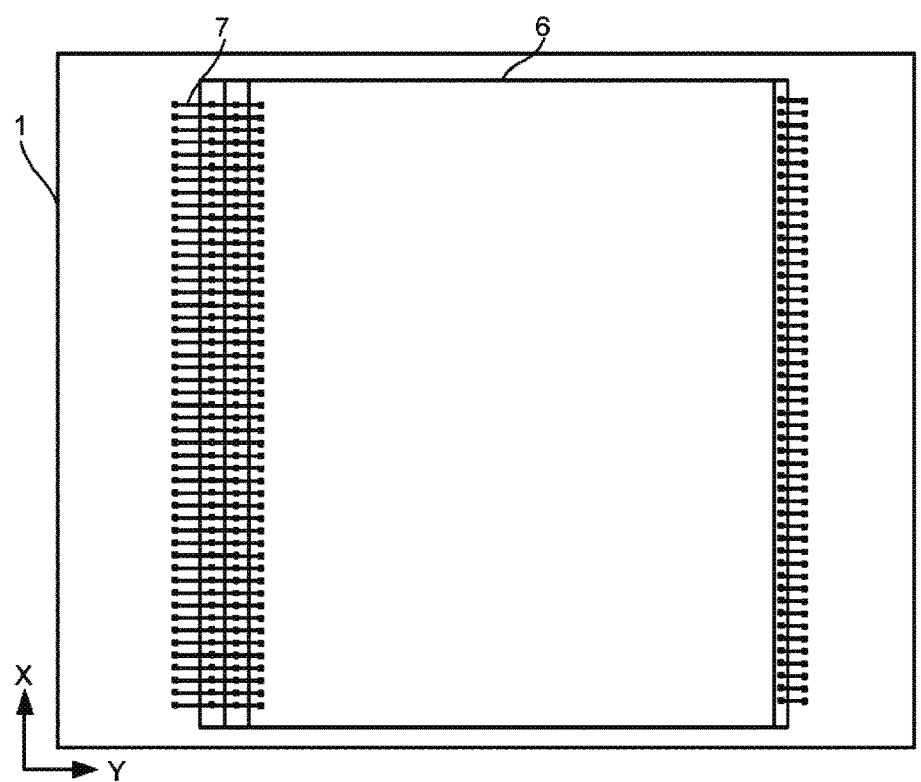
FIG. 3 is a schematic top view showing a structural example of a semiconductor device.
Figure 4:
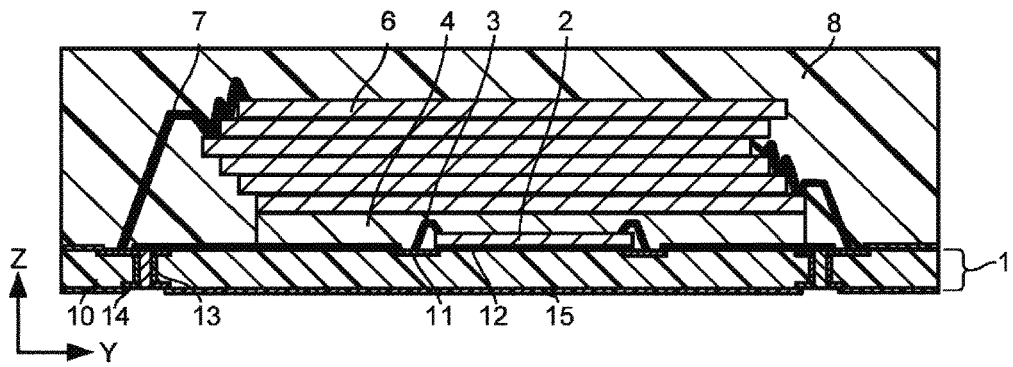
FIG. 4 is a schematic cross-sectional view showing a structural example of the semiconductor device.
Figure 5:
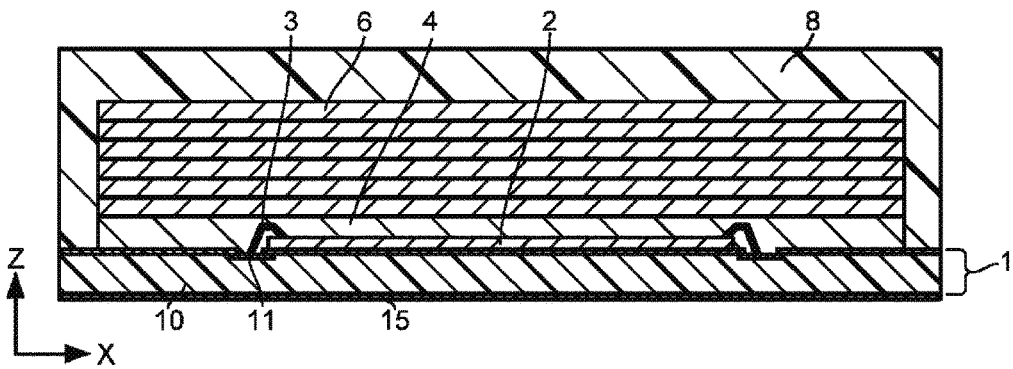
FIG. 5 is a schematic cross-sectional view showing a structural example of the semiconductor device.

Next, a structural example of a semiconductor device using the above printed wiring substrate will be described. FIG. 3 is a view showing an X-Y plane of the semiconductor device. FIG. 4 is a view showing a Y-Z cross section of the semiconductor device. FIG. 5 is a view showing an X-Z cross section of the semiconductor device.

The semiconductor device includes the printed wiring substrate 1, a semiconductor chip 2, a bonding wire 3, an insulating layer 4, a semiconductor chip 6, a bonding wire 7, and a sealing resin layer 8.

The printed wiring substrate 1 includes the wiring layer 11 provided on a first surface, the insulating layer 12 on the wiring layer 11, a conductive layer 14 electrically connected to the connection terminal 11a through a via 13 provided on the second surface and penetrating through the substrate 10 and having a function as a ground terminal, a signal terminal, or a power supply terminal, and an insulating layer 15 such as a solder resist including an opening for exposing a portion of the conductive layer 14.

Examples of the semiconductor chip 2 include a semiconductor chip used for a memory controller. The semiconductor chip 2 is mounted on the first surface of the printed wiring substrate 1 and provided on the insulating layer 12 via an organic adhesive layer such as a die attach film. The semiconductor chip 2 includes electrodes on the surface.

The bonding wire 3 electrically connects one of the connection terminals 11a of the wiring layer 11 and the electrodes of the semiconductor chip 2. Examples of the bonding wire 3 include a gold wire, a silver wire, a copper wire, and the like. The surface of the copper wire may be covered by a palladium film.

The insulating layer 4 covers the semiconductor chip 2 and the bonding wire 3. For example, a die attach film may be used as the insulating layer 4.

Examples of the semiconductor chip 6 include a semiconductor chip used for a memory element such as a NAND flash memory. The semiconductor chip 6 is mounted on the insulating layer 4 via an organic adhesive layer such as a die attach film. The semiconductor chip 6 includes electrodes and is stacked in multiple stages so as to expose the electrodes. The semiconductor chips 6 stacked in multiple stages are sequentially adhered via an organic adhesive layer such as a die attach film. The electrodes of the semiconductor chips 6 stacked in multiple stages are electrically connected to one of the connection terminals 11a of the wiring layer 11 with the bonding wire 7. The semiconductor chip 6 is electrically connected to the semiconductor chip 2 via the connection terminal 11a and the wiring 11b of the wiring layer 11.

The bonding wire 7 electrically connects one of the connection terminals 11a of the wiring layer 11 and the electrodes of the semiconductor chip 6. A wire applicable to the bonding wire 3 may be used as the bonding wire 7.

The sealing resin layer 8 seals the semiconductor chip 6. The sealing resin layer 8 contains an inorganic filler such as $SiO_2$. In addition to $SiO_2$, the inorganic filler may contain, for example, aluminum hydroxide, calcium carbonate, aluminum oxide, boron nitride, titanium oxide, or barium titanate. The inorganic filler is, for example, granular, and has a function of adjusting the viscosity, hardness, and the like of the sealing resin layer 8. The content of the inorganic filler in the sealing resin layer 8 is, for example, 60% or more and 90% or less. For example, a mixture of an inorganic filler and an insulating organic resin material may be used as the sealing resin layer 8. For example, an epoxy resin may be used as the organic resin material. The inorganic filler may be exposed on the surface of the sealing resin layer 8.

The opening 120, the protrusion portion 121, the recess portion 122, and the flat portion 123 shown in FIGS. 1 and 2 are formed, for example, at a connection portion between one of the connection terminals 11a of the wiring layer 11 and the bonding wire 3. The opening 120 is not limited thereto and for example, may be formed in the connection portion between one of the connection terminals 11a of the wiring layer 11 and the bonding wire 7.

When the opening 120 is formed in the connection portion between one of the connection terminals 11a of the wiring layer 11 and the bonding wire 3, the opening 120 is buried with the insulating layer 4. When the linear expansion coefficient of the insulating layer 4 is larger than the linear expansion coefficient of the insulating layer 12, stress is likely to be applied to the wiring 11b exposed by the opening 120 due to a temperature change. For example, the linear expansion coefficient of the solder resist used for the insulating layer 12 is about 30 ppm/° C., and the linear expansion coefficient of the die attach film used for the insulating layer 4 is about 100 ppm/° C.

Stress is likely to be concentrated along the edge of the opening 120. In particular, when a printed wiring substrate is used as a wiring substrate, stress is easily applied, and a crack may occur in the wiring 11b along the edge of the opening 120, and the wiring 11b may be broken, for example.

On the other hand, by providing the protrusion portion 121 or the recess portion 122 at the edge of the opening 120, the stress applied along the edge of the opening 120 is dispersed, and the stress applied to the wiring 11b can be reduced regardless of the crossing angle between the wiring 11b and the edge of the opening 120. Therefore, the cracks of the wiring 11b can be prevented.

Furthermore, peeling of the insulating layer 12 can be prevented by providing the flat portion 123 with the protrusion portion 121 and the recess portion 122. If the protrusion portions 121 and the recess portions 122 are provided on all the edges of the opening 120, the insulating layer 12 is easily peeled off from the substrate 10 because the contact area with the insulating layer 4 is too large.

In FIG. 4, an opening is provided in the printed wiring substrate 1 to expose a pad to which the bonding wire 7 is connected. In this opening, like the opening 120, the protrusion portion 121 and the recess portion 122 may not be provided, and only the flat portion 123 may be provided at all the edges. This is because the difference between the linear expansion coefficient of the solder resist or the like forming the insulating layer 12 and the linear expansion integer of the sealing resin layer 8 may be smaller than the difference between the linear expansion coefficient of the solder resist or the like and the linear expansion coefficient of the die attach film forming the insulating layer 4. The opening that exposes the connection terminal 11a electrically connected to the bonding wire 7 is buried with the sealing resin layer 8. For this reason, the stress due to the difference in the linear expansion coefficient is small, and a crack is not easily generated in the wiring 11b.

Figure 6:
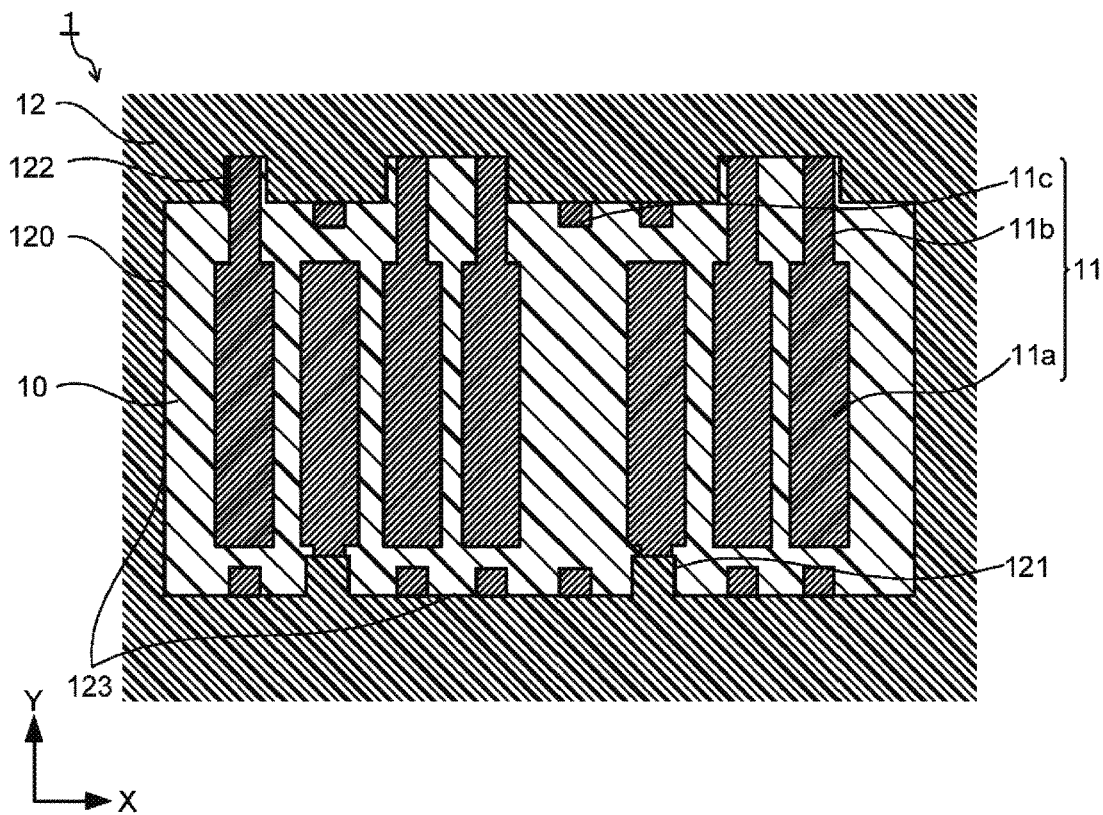
FIG. 6 is a schematic cross-sectional view showing another structural example of the printed wiring substrate.
Figure 7:
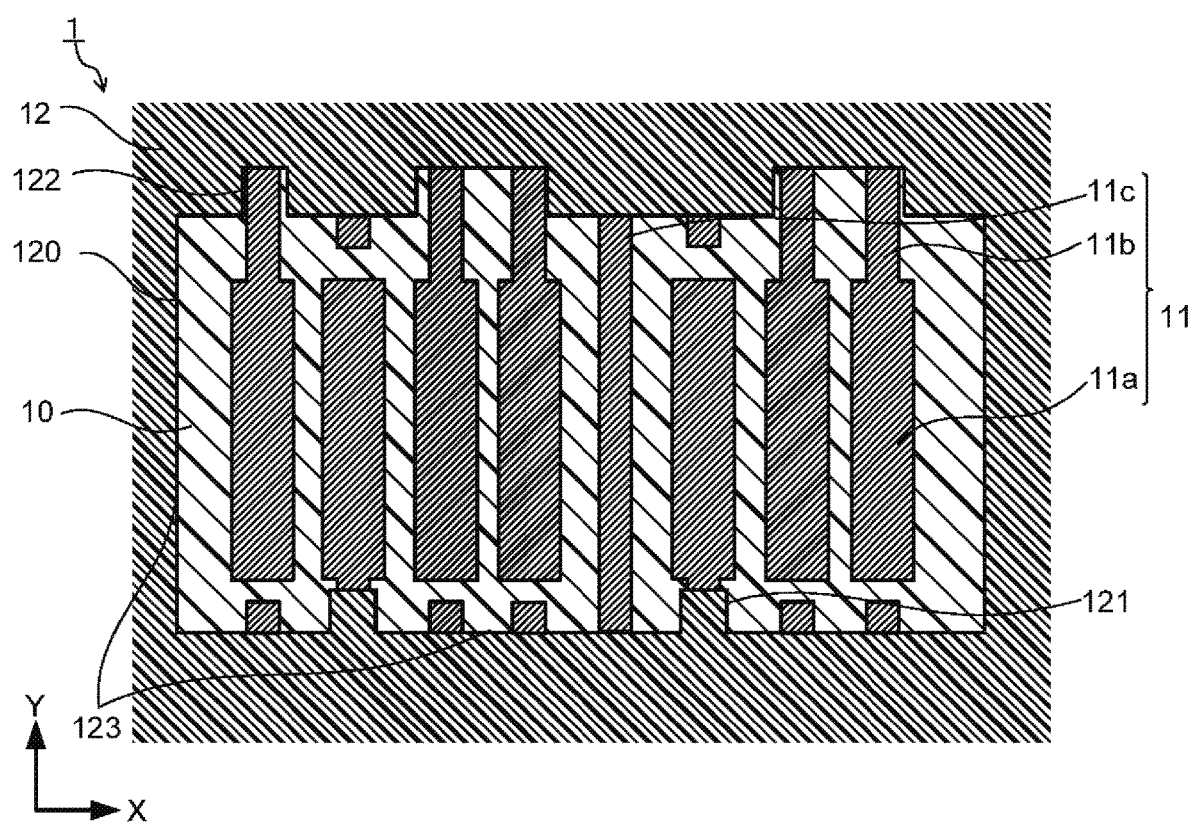
FIG. 7 is a schematic cross-sectional view showing another structural example of the printed wiring substrate.

The configuration of the printed wiring substrate 1 is not limited to the configuration shown in FIGS. 1 and 2. FIGS. 6 and 7 are schematic top views showing another structural example of the printed wiring substrate 1 and show a portion of the X-Y plane of the printed wiring substrate 1.

The printed wiring substrate 1 shown in FIGS. 6 and 7 differs from the printed wiring substrate 1 shown in FIG. 1 in that the wiring layer 11 further includes a dummy wiring 11c. The above description may be appropriately applied to the same portions as the elements of the printed wiring substrate 1 shown in FIG. 1. In addition, portions different from the elements of the printed wiring substrate 1 shown in FIG. 1 may be combined appropriately.

The dummy wirings 11c are juxtaposed on the surface of the substrate 10 together with the wirings 11b, for example, along a first direction (for example, the X-axis direction) of the substrate 10. The dummy wiring 11c is electrically connected to or separated from the connection terminal 11a or the wiring 11b. The dummy wiring 11c may be provided, for example, between two or more wirings 11b. A portion of the dummy wiring 11c is exposed from the insulating layer 12 by the opening 120. As shown in FIG. 7, two or more dummy wirings 11c may be electrically connected and electrically separated from the connection terminal 11a.

By providing the dummy wiring 11c, the uniformity of the wiring density (the interval between the wiring 11b and the dummy wiring 11c) in the opening 120 can be improved. Thereby, stress concentration on the wiring 11b can be further prevented. Therefore, the cracks of the wiring 11b can be prevented.

The end in the extending direction of the dummy wiring 11c is preferably separated from the end in the extending direction of the protrusion portion 121 along a second direction (for example, the Y direction) intersecting with the first direction. When the end in the extending direction of the dummy wiring 11c is along the end in the extending direction of the protrusion portion 121 and the second direction for example, when the opening 120 is buried with the insulating layer 4, stress is likely to be concentrated on the wiring 11b and the dummy wiring 11c.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a printed wiring substrate including
      a substrate,
      a wiring layer provided on the substrate, and
      a first insulating layer provided on the wiring layer,
         wherein the wiring layer includes a connection terminal and a wiring electrically connected to the connection terminal, and
         wherein the first insulating layer that includes an opening that exposes at least a portion of the connection terminal and at least a portion of the wiring, and at least one of a protrusion portion or a recess portion, provided along a first edge of the opening, that overlaps the wiring;
   a semiconductor chip mounted on the printed wiring substrate;
   a bonding wire that electrically connects the connection terminal to the semiconductor chip; and
   a second insulating layer that covers the semiconductor chip, the bonding wire, and the opening.

2. The semiconductor device according to claim 1, wherein
   a linear expansion coefficient of the second insulating layer is greater than a linear expansion coefficient of the first insulating layer.

3. The semiconductor device according to claim 1, wherein
   the first insulating layer is a solder resist, and
   the second insulating layer is a die attach film.

4. The semiconductor device according to claim 1, wherein
   the first insulating layer further includes a flat portion provided along at least one of the first edge or a second, different edge of the opening.

5. The semiconductor device according to claim 1, wherein
   the wiring layer further includes a dummy wiring, and
   the opening exposes a portion of the dummy wiring.

6. The semiconductor device according to claim 5, wherein
   the first insulating layer includes the protrusion portion,
   the wiring and the dummy wiring are juxtaposed along a first direction, and
   at least one of ends of the dummy wiring is separated from both ends of the protrusion portion along the first direction.

7. The semiconductor device according to claim 1, further comprising:
   one or more semiconductor chips provided on the second insulating layer; and
   a third insulating layer covering the one or more semiconductor chips and the substrate.

8. The semiconductor device according to claim 7, wherein the third insulating layer includes an inorganic filler.

9. The semiconductor device according to claim 7, wherein the inorganic filler includes at least one of: SiO2, aluminum hydroxide, calcium carbonate, aluminum oxide, boron nitride, titanium oxide, or barium titanate.

10. The semiconductor device according to claim 1, wherein a linear expansion coefficient of the second insulating layer is about 100 ppm/° C., and a linear expansion coefficient of the first insulating layer is about 30 ppm/° C.

11. A semiconductor device comprising:
    a substrate;
    a wiring layer provided on the substrate; and
    a first insulating layer provided on the wiring layer,
       wherein the wiring layer includes a connection terminal and a wiring electrically connected to the connection terminal,
       and wherein the first insulating layer includes an opening that exposes the connection terminal and a portion of the wiring, and at least one of a protrusion portion or a recess portion, provided along at least one edge of the opening, that overlaps the wiring.

12. The semiconductor device according to claim 11, further comprising:
    a semiconductor chip mounted on the substrate;
    a bonding wire that electrically connects the connection terminal to the semiconductor chip; and
    a second insulating layer that covers the semiconductor chip, the bonding wire, and the opening.

13. The semiconductor device according to claim 12, wherein a linear expansion coefficient of the second insulating layer is greater than a linear expansion coefficient of the first insulating layer.

* * * * *